United States Patent
Ozeki et al.

(10) Patent No.: US 6,451,645 B1
(45) Date of Patent: Sep. 17, 2002

(54) METHOD FOR MANUFACTURING SEMICONDUCTOR DEVICE WITH POWER SEMICONDUCTOR ELEMENT AND DIODE

(76) Inventors: Yoshihiko Ozeki, c/o Denso Corporation, 1-1, Showa-cho, Kariya-city, Aichi-pref., 448-8661 (JP); Yoshifumi Okabe, c/o Denso Corporation, 1-1, Showa-cho, Kariya-city, Aichi-pref., 448-8661 (JP); Yutaka Tomatsu, c/o Denso Corporation, 1-1, Showa-cho, Kariya-city, Aichi-pref., 448-8661 (JP)

( * ) Notice: Subject to any disclaimer, the term of this patent is extended or adjusted under 35 U.S.C. 154(b) by 0 days.

(21) Appl. No.: 09/902,505

(22) Filed: Jul. 11, 2001

(30) Foreign Application Priority Data

Jul. 12, 2000 (JP) .......................... 2000/211503
Jun. 19, 2001 (JP) .......................... 2001/185485

(51) Int. Cl.$^7$ .......................... H01L 21/8234
(52) U.S. Cl. .................. 438/237; 438/279; 438/251
(58) Field of Search .................. 438/237, 211, 438/216, 225, 231, 232, 233, 251, 252, 257, 258, 279, 297, 301; 257/603, 630

(56) References Cited

U.S. PATENT DOCUMENTS

| 4,721,686 A | 1/1988 | Contiero et al. |
| 5,250,449 A | 10/1993 | Kuroyanagi et al. |
| 5,475,258 A | 12/1995 | Kato et al. |
| 5,595,918 A | 1/1997 | Kinzer |
| 5,798,550 A | 8/1998 | Kuroyanagi et al. |
| 5,834,809 A | 11/1998 | Kato et al. |

FOREIGN PATENT DOCUMENTS

| JP | A-60-5561 | 1/1985 |
| JP | A-64-67911 | 3/1989 |
| JP | A-2-77135 | 3/1990 |
| JP | A-4-180238 | 6/1992 |
| JP | A-7-86578 | 3/1995 |
| JP | A-8-321553 | 12/1996 |
| JP | A-9-270510 | 10/1997 |
| JP | A-2000-12843 | 1/2000 |
| JP | A-2000-58818 | 2/2000 |
| JP | A-2000-91572 | 3/2000 |

*Primary Examiner*—Olik Chaudhuri
*Assistant Examiner*—Yennhu B. Huynh
(74) *Attorney, Agent, or Firm*—Law Offices of David G. Posz (57) ABSTRACT

In a method for forming a semiconductor device having a power MOSFET and a diode, after a gate electrode and n$^+$ type source regions for the power MOSFET and an n$^+$ type region of a poly-Si layer for the diode are formed, an oxide film is formed by thermal oxidation. At that time, accelerated oxidation occurs where an n$^+$ type impurity is heavily implanted, so that the oxide film becomes thick on the surfaces of the gate electrode, the source regions, and the n$^+$ type region, as compared to the other region. Then, a p type impurity is self-alignedly implanted through the oxide film serving as a mask to form a p$^+$ type contact region for the MOSFET and a p$^+$ type region of the poly-Si layer for the diode.

17 Claims, 6 Drawing Sheets

METHOD FOR MANUFACTURING SEMICONDUCTOR DEVICE WITH POWER SEMICONDUCTOR ELEMENT AND DIODE

CROSS REFERENCE TO RELATED APPLICATIONS

This application is based upon and claims the benefit of Japanese Patent Applications No. 2000-211503 filed on Jul. 12, 2000, and No. 2001-185485 filed on Jun. 19, 2001, the contents of which are incorporated herein by reference.

BACKGROUND OF THE INVENTION

1. Field of the Invention

This invention relates to a method of manufacturing a semiconductor device having a power semiconductor element such as a MOSFET or an IGBT.

2. Description of the Related Art

Figure 4A:
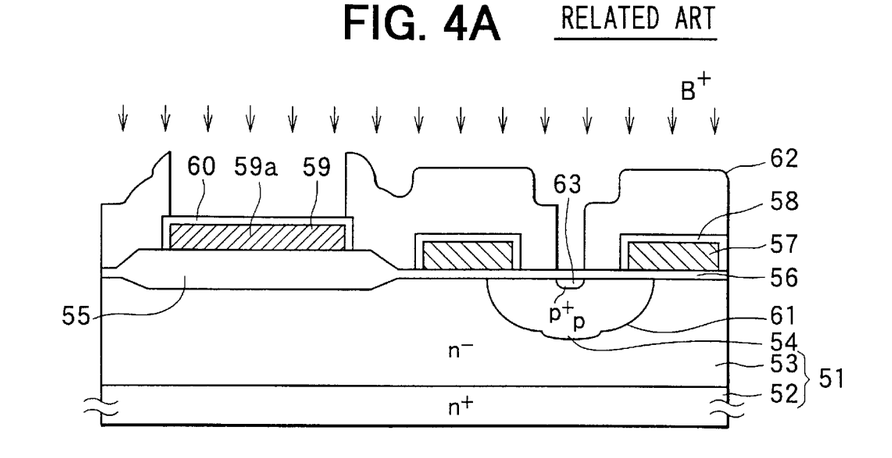
FIGS. 4A to 4C are cross-sectional views showing a method for manufacturing a semiconductor device in a related art.
Figure 4B:
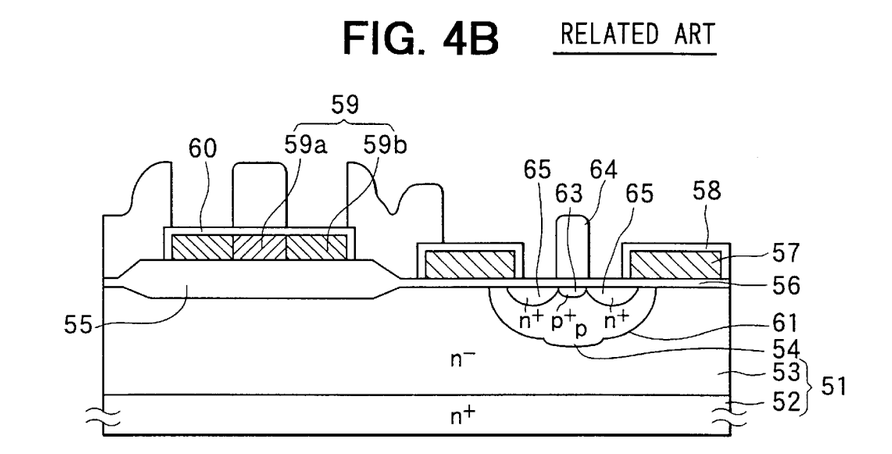
Figure 4C:
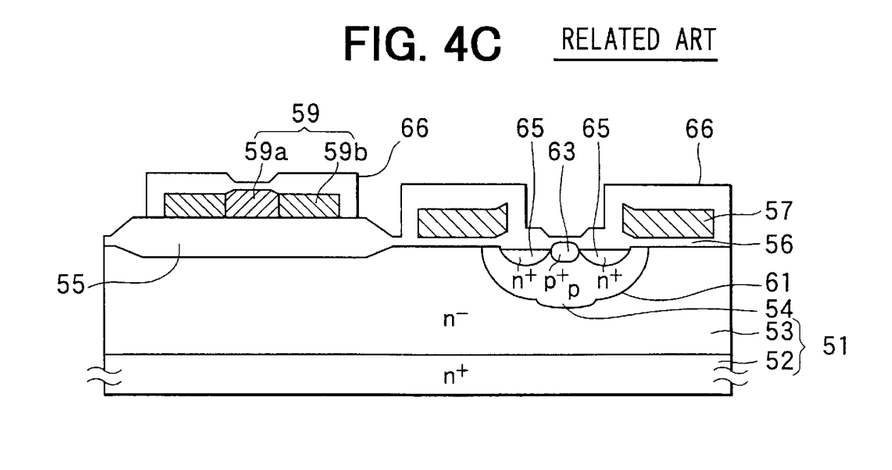

A power semiconductor device formed with a power semiconductor element such as a MOSFET or an IGBT and a poly-Si Zener diode is conventionally known. FIGS. 4A to 4C show a method in a stepwise manner for manufacturing a semiconductor device formed with a vertical power MOSFET and a poly-Si Zener diode, which is explained below.

[Step Shown in FIG. 4A]

First, a wafer 51 composed of an $n^+$ type substrate 52 and an $n^-$ type epi-layer (epitaxial layer) 53 disposed on the $n^+$ type substrate 52 is prepared. Then, a p type deep base region 54 is formed in the $n^-$ type epi-layer 53 in an area where the vertical power MOSFET is to be formed (MOSFET formation area) by a photolithography step. Next, a LOCOS film 55 is formed by LOCOS oxidation in an area where the poly-Si Zener diode is to be formed (diode formation area), and then, a gate oxide film 56 is formed by gate oxidation in the MOSFET formation area.

After that, a poly-Si layer is deposited on an entire surface of the wafer 51, and phosphorous (P) is ion-implanted to lower the resistance of the poly-Si layer. The poly-Si layer is patterned, thereby forming gate electrodes 57 in the MOSFET formation area. Further, thermal oxidation is performed to cover the gate electrodes 57 with an oxide film 58. Another poly-Si layer 59 is deposited, and is patterned to remain in the diode formation area. Thermal oxidation is then performed to cover the poly-Si layer 59 with an oxide film 60.

Successively, a p type base region (channel-well region) 61 is formed in the $n^-$ type epi-layer 53 between the adjacent two gate electrodes 57, by a photolithography step. After a specific region is covered with photoresist 62, a $p^+$ type contact region 63 is formed in a surface portion of the p type deep base region 54 and simultaneously a $p^+$ type region 59a are formed in the poly-Si layer 59 by ion-implanting boron (B).

[Step Shown in FIG. 4B]

After the photoresist 62 is removed and a specific region is covered with photoresist 64, arsenic (As) is ion-implanted to form $n^+$ type source regions 65 and to form an $n^+$ type region 59b in the poly-Si layer 59.

[Step Shown in FIG. 4C]

After the photoresist 64 is removed, rounding oxidation is performed by a heat treatment. Accordingly, an oxide film 66 is formed almost on the entire surface of the wafer 51. At that time, accelerated oxidation occurs on the surface of the $n^+$ type regions, so that the thickness of the oxide film 66 on the $n^+$ type regions becomes thicker than that on the $p^+$ type region.

After that, although it is not shown, after contact holes are formed in the oxide film 66, an Al-Si layer is deposited as a wiring layer, and is patterned. Further, the surface of the wafer 51 is covered with a protective film. Thus, the semiconductor device having the vertical power MOSFET and the Zener diode is completed. The method as described above is, however, required being simplified further.

SUMMARY OF THE INVENTION

An object of the present invention is to simplify a method for manufacturing a semiconductor device having a power semiconductor element and a diode.

To achieve the above object, according to the present invention, first, an insulation film is formed on a semiconductor layer of a first conductivity type and first and second electrode materials are disposed on the insulation film, respectively in a first area for forming a power semiconductor element and in a second area for forming a diode. A channel-well region of a second conductivity type is formed in a surface portion of the semiconductor layer in the first area, and a first conductivity type impurity is ion-implanted into a surface portion of the channel-well region to form a source (emitter) region of the first conductivity type, into the first electrode material to form a gate electrode, and into a part of the second electrode material to form a first conductivity type region. Then, a heat treatment is performed to form an oxide film by surface oxidation on the first area having the gate electrode and the source (emitter) region, and on the second electrode material including the first conductivity type region. After that, a second conductivity type impurity is ion-implanted into the channel-well region to form a contact region in the first area, and into the second electrode material to form a second conductivity type region in the second area, through the oxide film serving as a mask.

Thus, when the oxide film is formed after ion-implanting the first conductivity type impurity, accelerated oxidation occurs where the first conductivity type impurity is implanted. Therefore, the oxide film can work as a mask for ion-implanting the second conductivity type impurity to form the contact region and the second conductivity type region by utilizing a difference in thickness thereof produced by the accelerated oxidation. As a result, the method for manufacturing the semiconductor device having both the power semiconductor element and the diode can be simplified.

BRIEF DESCRIPTION OF THE DRAWINGS

Other objects and features of the present invention will become more readily apparent from a better understanding of the referred embodiments described below with reference to the following drawings, in which.

DETAILED DESCRIPTION OF THE PREFERRED EMBODIMENTS

First Embodiment

Figure 1:
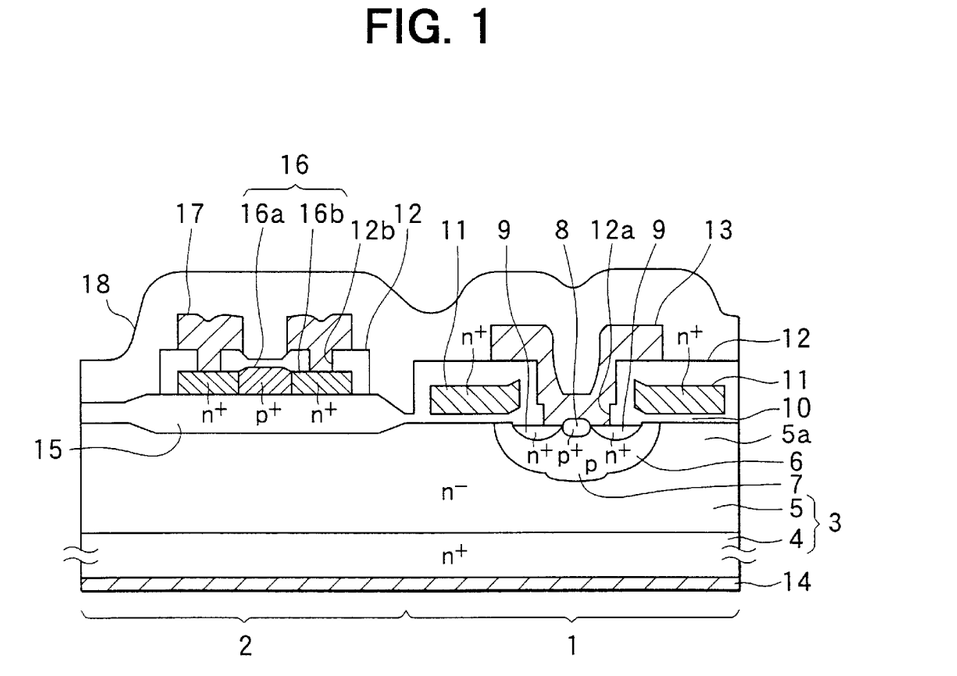
FIG. 1 is a cross-sectional view showing a semiconductor device that is manufactured by a method according to a preferred embodiment of the present invention.

A semiconductor device manufactured by a method according to a first preferred embodiment of the present invention is explained with reference to FIG. 1. The semiconductor device shown in FIG. 1 is formed with a vertical power MOSFET 1 and a poly-Si Zener diode 2.

A wafer 3 used for the semiconductor device is composed of an n$^+$ type substrate 4 made of n$^+$ type silicon having a thickness in a range of about 500 to 600 μm and an impurity concentration of about 3×10$^{19}$ cm$^{-3}$, and an n$^-$ type epi-layer 5 that is formed on the main surface of the n$^+$ type substrate 4 to have a thickness of about 7 μm and an impurity concentration of about 1×10$^{16}$ cm$^{-3}$. The vertical power MOSFET 1 and the poly-Si Zener diode 2 are formed on the n$^-$ type epi-layer 5 of the wafer 3.

In the MOSFET formation area, a p type base region (channel-well region) 6 is formed in the surface portion of the n$^-$ type epi-layer 5, and a p type deep base region 7 is formed in a central portion of the p type base region 6, at a junction depth deeper than that of the p type base region 6.

A p$^+$ type contact region 8 is formed in the surface portion of the p type deep base region 7 for providing electrical connection with the p type base region 6 and the p type deep base region 7. Further, n$^+$ type source regions 9 are formed in the surface portion of the p type base region 6 to sandwich the p$^+$ type contact region 8. The n$^+$ type source regions 9 are formed in the p type base region 6 to be separated from a drift region 5a constituted by the n$^-$ type epi-layer 5.

The surface portion of the p type base region 6 defined between each n$^+$ type source region 9 and the drift region 5a works as a channel region, and a gate electrode 11 is formed above the channel region through a gate oxide film 10. The gate electrode 11 is covered with an oxide film 12. A wiring layer (source electrode) 13 made of Al-Si is electrically connected to the p+ type contact region 8 and the n$^+$ type source regions 9 through a contact hole 12a formed in the oxide film 12. A drain electrode 14 is formed on the back surface of the n$^+$ type substrate 4.

On the other hand, in the diode formation area, a LOCOS film 15 is formed on the surface of the n$^-$ type epi-layer 5. A p$^+$ type region 16a, which is formed by implanting a p type impurity into a poly-Si layer 16, and n$^+$ type regions 16b, which are formed by implanting an n type impurity into the poly-Si layer 16, are formed on the LOCOS film 15. The p$^+$ type region 16a and each of the n$^+$ type regions 16b form a PN junction.

The oxide film 12 is formed on the p$^+$ type region 16a and the n$^+$ type regions 16b as well. The oxide film 12 has a thickness that is thick on the n$^+$ type regions 16b as compared to that on the p$^+$ type region 16a. Contact holes 12b are formed in the oxide film 12, and wiring layers 17 are electrically connected with the n$^+$ type regions 16b through the contact holes 12b.

The wafer surface including the MOSFET formation area and the diode formation area is covered with a protective film 18. Incidentally, though it is not shown in FIG. 1, the gate electrode 11 and the p$^+$ type region 16a are electrically connected to wiring layers through other contact holes formed in the oxide layer 12.

Figure 2A:
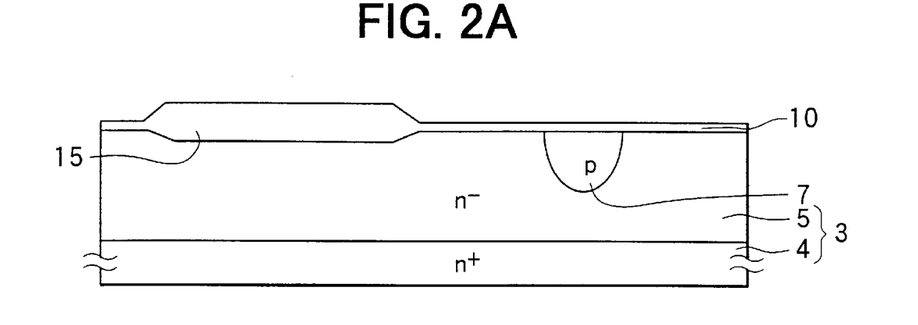
FIGS. 2A to 2C and 3A to 3C are cross-sectional views showing the method for manufacturing the semiconductor device in a stepwise manner.

Successively, the method for manufacturing the semiconductor device is explained with reference to FIGS. 2A–2C and 3A–3C.
[Step Shown in FIG. 2A]
First, the wafer 3 having the n$^-$ type epi-layer 5, which is grown on the main surface of the n$^+$ type substrate 4 made of n$^+$ type silicon having (100) plane orientation, is prepared. Then, the p type deep base region 7 is formed by a photolithography step in the MOSFET formation area. Next, after the LOCOS film 15 is formed by LOCOS oxidation in the diode formation area, the gate oxide film 10 is formed by gate oxidation in the MOSFET formation area.
[Step Shown in FIG. 2B]
After a non-doped poly-Si layer (electrode material layer) is deposited on the entire surface of the wafer 3 to have a thickness of, for example, 7400 Å, the poly-Si layer is patterned so that the gate electrode 11 is formed in the MOSFET formation area and the poly-Si layer remains in the diode formation area as the poly-Si layer 16. Then, the surfaces of the gate electrodes 11 and the poly-Si layer 16 are covered with an oxide film 21 by thermal oxidation. The oxide film 21 is preferably not thick. This is because, at a following step utilizing accelerated oxidation described below, an accelerated oxidation effect appears prominently as the oxide film on n$^+$ type regions is initially thin. In this embodiment, the thickness of the oxide film 21 is controlled to be about 600 Å.
[Step Shown in FIG. 2C]
The p type base region (channel-well region) 6 is formed in the n$^-$ type epi-layer 5 between the gate electrodes 11 by a photolithography step and an ion-implantation of a p-type impurity using the gate electrode 11 as a mask.
[Step Shown in FIG. 3A]
After a specific region is covered with photoresist 22, an n type impurity is ion-implanted. As described below, in the case of utilizing the accelerated oxidation caused on the n$^+$ type regions, after the n$^+$ type regions are formed, p type regions are formed. Therefore, thermal hysteresis produced after implanting the n type impurity is enhanced as compared to a conventional step. However, it is desirable that the diffusion depth of the n$^+$ type source region is shallow in view of a latch-up withstand amount at the MOSFET part. Therefore, in this embodiment, arsenic (As) having a diffusion coefficient smaller than that of phosphorous (P) is used as an n type impurity and is ion-implanted. Further, ion-implantation energy is set at 135 keV and a dose is set at 7.2×10$^{15}$ cm$^{-2}$ to obtain desirable diode characteristics.

Figure 3A:
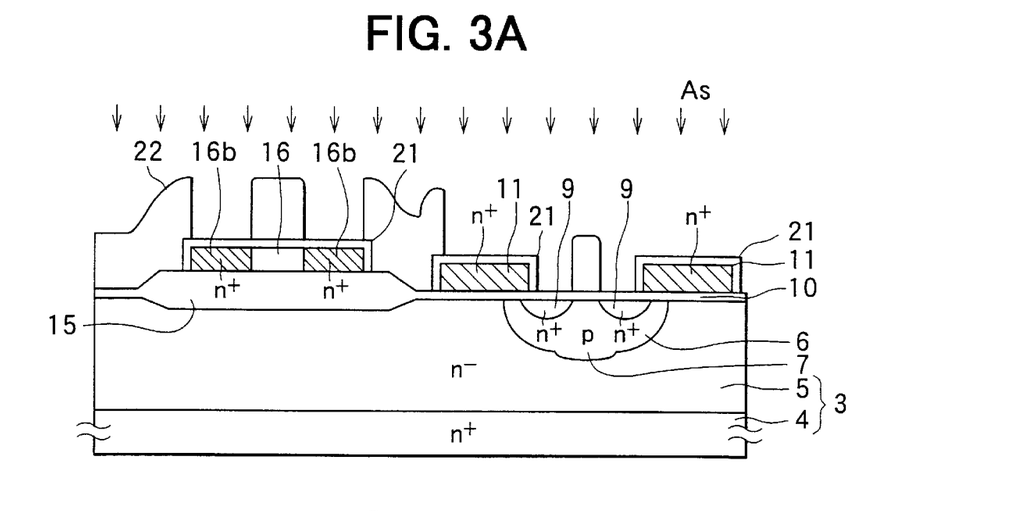

Accordingly, the n type impurity is doped into the surface portion of the p type base region 6, the gate electrodes 11, and the poly-Si layer 16. After that, a heat treatment is performed, for example, at 1050° C., in N$_2$ atmosphere, for 30 minutes to thermally diffuse implanted ions. Inconsequence, then n$^+$ type source regions 9 are formed, the resistance of the gate electrodes 11 is lowered, and the n$^+$ type regions 16b are formed in the poly-Si layer 16 simultaneously.
[Step Shown in FIG. 3B]
After the photoresist 22 is removed, the oxide film 12 is formed on the surface of the wafer 3 by thermal oxidation (surface oxidation). For example, thermal oxidation is performed at 875° C. in wet atmosphere. Accordingly, the oxide film 12 is formed almost on the entire surface of the wafer 3. On the regions where the n$^+$ type impurity is doped at a high concentration, accelerated oxidation occurs. Therefore, the oxide film 12 is formed with a larger thickness on the surfaces of the n$^+$ type source regions 9, the gate electrodes 11, and the n$^+$ type regions 16b of the poly-Si layer 16, as compared to the other surface regions.

For example, the oxide film thickness on the n$^+$ type source regions 9 is about 3290 Å, while the oxide film thickness on the p type deep base region 7 is about 1780 Å. The oxide film thickness on the n$^+$ type regions 16b of the poly-Si layer 16 is about 2450 Å, while the oxide film thickness on the poly-Si layer 16 other than the n$^+$ type regions 16b (i.e., on the p$^+$ type region 16a in FIG. 1) is about 1960 Å. That is, in this embodiment, the difference in thickness of the oxide film between the n$^+$ type regions and the other region in the MOSFET formation area arises about 1510 Å. As opposed to this, the difference in thickness of the oxide film between the n+ type regions and the other region in the diode formation area arises only about 490 Å.

Figure 3B:
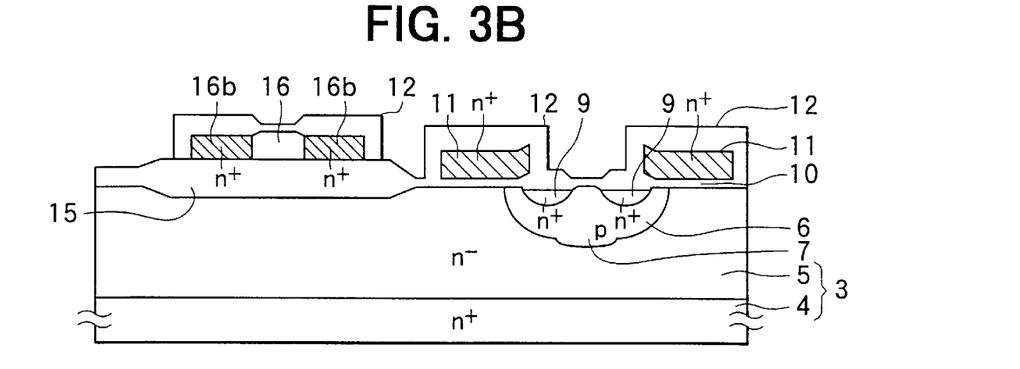
Figure 3C:
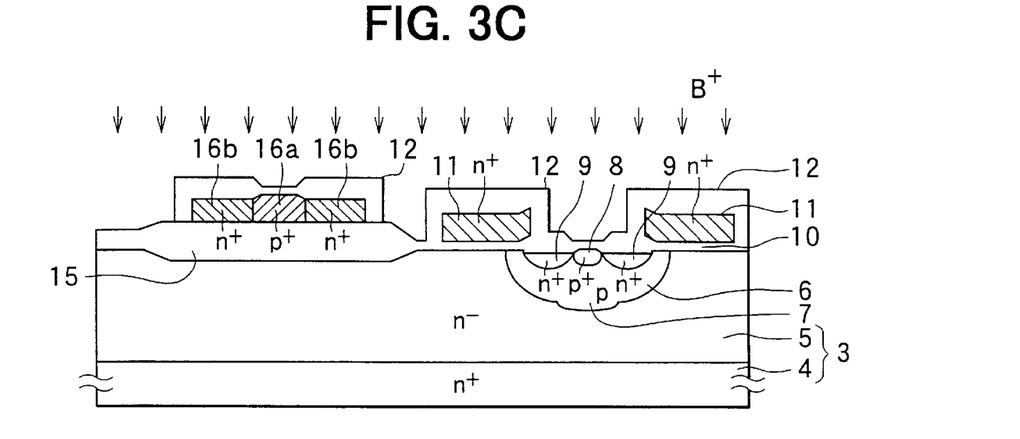

[Step Shown in FIG. 3C]

Ion-implantation of boron as a p type impurity is then performed to the entire surface of the wafer 3. At that time, as described above, the difference in thickness of the oxide film between the n+ type regions and the other region is small in the diode formation area as compared to that in the MOSFET formation area. Therefore, in the diode formation area, an acceleration voltage (projection range) for the ion-implantation should be controlled so that boron can be implanted into the region other than then n+ type regions 16b and so that boron can be stopped (trapped) in the oxide film 12 above the n+ type regions 16b not to be implanted into the n+ type regions 16b. In this embodiment, the acceleration voltage of boron is set at 60 keV considering the variation in the projection range. The dose is set at $6.0 \times 10^{14}$ cm$^{-2}$ to obtain desirable voltage Vz of the diode.

Accordingly, the p type impurity is doped into the regions where the oxide film 12 is thin, i.e., into the portion between the n+ type source regions 9 in the MOSFET formation area, and into the portion of the poly-Si layer 16 other than the n+ type regions 16b. After that, a thermal treatment for activation and diffusion of boron is performed.

This thermal treatment should be performed at the minimum level capable of forming the diode. This is because excessive heat treatment can increase diffusion (junction) depth Xj of the n+ type source regions, which has already been formed in the MOSFET formation area, to decrease the latch-up withstand amount. On the other hand, if the heat treatment is insufficient, the concentration of boron varies in the depth direction of the poly-Si layer 16 in the diode formation area. The insufficient heat treatment may result in breakage of the PN junction at the surface of the poly-Si layer 16, a lowered withstand voltage, production of hot carriers, and the like. In this embodiment, considering the points as described above, the heat treatment is performed at 1050° C., in N$_2$ atmosphere, for 30 minutes. Accordingly, the p+ type contact region 8 is formed and simultaneously, the p+ type region 16a is formed in the poly-Si layer 16.

Also in this step, because the regions where the oxide film 12 is thin are defined by the positions of the n+ type source regions 9 and the n+ type regions 16b, the p+ type contact region 8 and the p+ type region 16a can be self-aligned with respect to the n+ type source regions 9 and the n+ type regions 16b.

Then, after the contact holes 12a, 12b are formed in the oxide film 12, the wiring layers 13, 17 are formed and patterned, and the drain electrode 14 is formed on the back surface of the n+ type substrate 4. Further, the main surface of the wafer 3 is covered with the protective film 18. Thus, the semiconductor device shown in FIG. 1 is completed.

As explained above, according to the present embodiment, the oxide film works, by utilizing the difference in thickness thereof, as a mask for forming the p+ type contact region 8 and the p+ type region 16a of the poly-Si layer 16. Therefore, it is not necessary to form a mask only for forming the p+ type contact region 8 and the p+ type region 16a. Accordingly, the process for manufacturing the semiconductor device including both the power semiconductor element (power MOSFET) and the Zener diode can be simplified. In addition, because the gate electrodes 11 for the power semiconductor element and the poly-Si layer for the Zener diode can be formed from a common poly-Si layer, the process for manufacturing the semiconductor device can further be simplified.

Conventionally, doping of impurity into the gate electrode 11 is performed to reduce the resistance by implanting ions of phosphorous into the poly-Si layer deposited on the entire surface of the wafer before it is patterned. On the other hand, in the present embodiment, the ion-implantation for forming the n+ type source regions 9 and the n+ type regions 16b simultaneously reduces the resistance of the gate electrode 11. Therefore, also in this point, the manufacturing process can be simplified.

Second Embodiment

Next, a second preferred embodiment is explained mainly in points different from the first embodiment. The same parts as those in the first embodiment are designated with the same reference numerals.

Figure 2B:
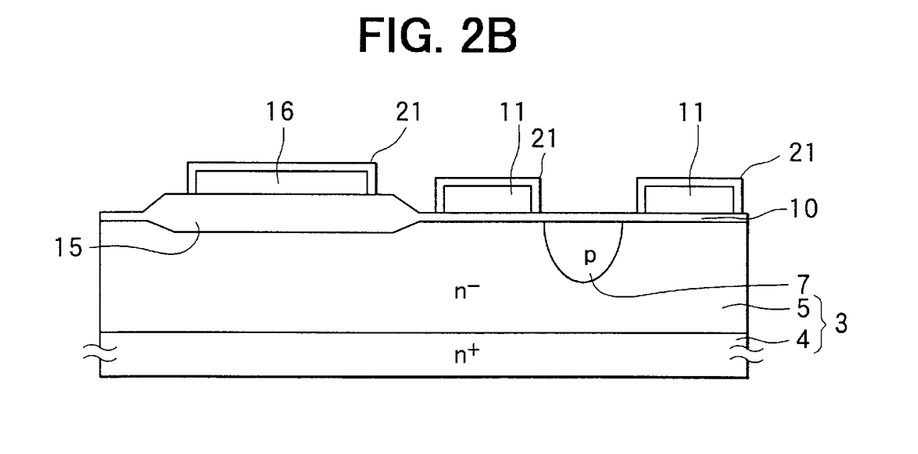
Figure 2C:
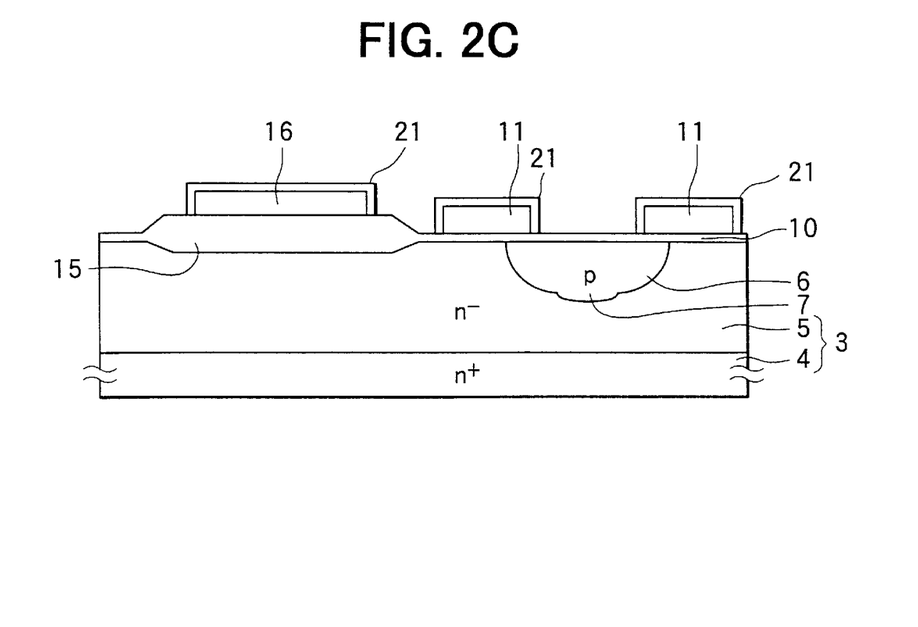
Figure 5A:
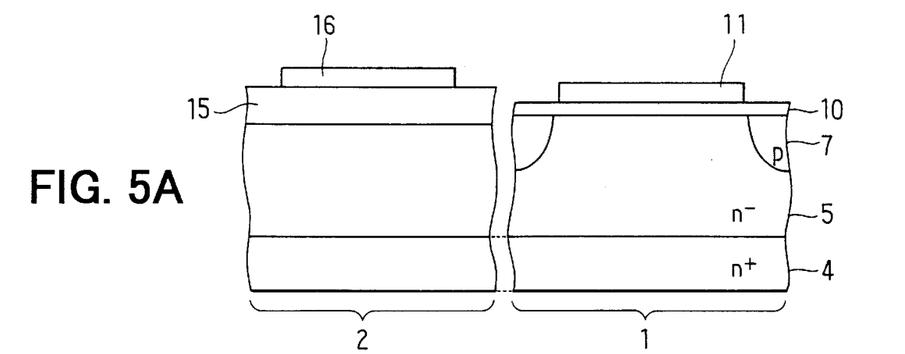
FIGS. 5A to 5C are cross-sectional views showing steps for manufacturing a semiconductor device in a second preferred embodiment of the present invention.
Figure 5B:
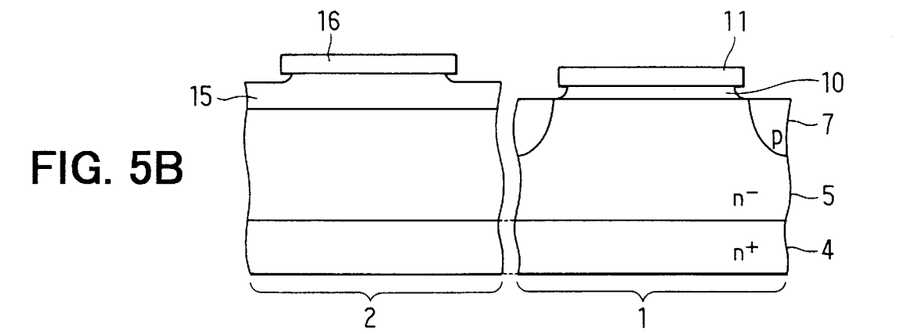

At a step corresponding to the step shown in FIG. 2B of the first embodiment, in the second embodiment, a part of the gate oxide film 10 is removed by using hydrogen fluoride (HF) after the poly-Si layer is patterned and before the oxide film 21 is formed. Specifically, as shown in FIG. 5A, after the poly-Si layer is patterned, wet-etching is performed with the patterned poly-Si layer (gate electrode 11) that serves as a mask. Thus, as shown in FIG. 5B, the part of the oxide film 10 exposed from the mask is removed.

In the wet-etching, the condition is set so that the gate oxide film 10 is over-etched under the gate electrode 11. Accordingly, the side edge corner portions of the gate electrode 11 at the lower side are also exposed. For example, when the thickness of the gate oxide film 10 is 600 Å, the condition is set so that over-etching of 20–30% can be achieved with HF aqueous solution of 4:1. At that time, likewise, the oxide film is over-etched under the peripheral edge (side edge) corner portions of the poly-Si layer 16 on the LOCOS film 15. That is, the surface portion of the LOCOS film 15 is etched to expose the peripheral edge corner portions of the poly-Si layer 16.

Figure 5C:
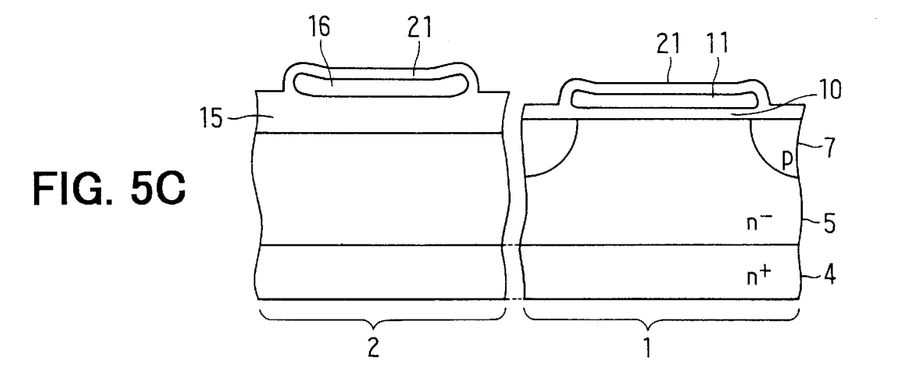

In this state, similarly to the step shown in FIG. 2B, thermal oxidation is performed to form the oxide film 21 that covers the surfaces of the epi-layer 5, the gate electrode 11, and the poly-Si layer 16 (FIG. 5C). In this case, because the lower edge (corner) portions of the gate electrode 11 are exposed as shown in FIG. 5B, oxidation of the poly-Si layer is promoted at these regions. Accordingly, the edge portions of the gate electrode 11 are rounded by the oxidation to have an increased radius of curvature. Likewise, in the diode formation area, the edge portions of the poly-Si layer 16 are rounded by the oxidation.

When this oxidation involves wet-oxidation, the oxide film grows so that the gate oxide film 10 is thick at the lower edge portions of the gate electrode 11 as compared to that at the middle portion of the gate electrode 11. In consequence, the oxidation raises the edge portions of the gate electrode 11 to form tapered portions at the edge portions thereof. That is, the oxidation is promoted at the edge portions of poly-Si layer constituting the gate electrode 11 while consuming poly-Si at those regions. As a result, the corner portions of the gate electrode 11 have large radius of curvature and the thickness of the gate oxide film 10 is thickened at those regions.

The followings steps are substantially the same as those explained in the first embodiment referring to FIGS. 2C and 3A to 3C, and therefore, the same explanations are not reiterated.

Incidentally, the thermal oxidation step shown in FIG. 3B forms a mask for implanting boron ions at the step shown in FIG. 3C, as a result of the accelerated oxidation occurring on the gate electrode 11 and the n+ type source regions 9. In addition to that, in the second embodiment, the step shown in FIG. 3B can further increase the radius of curvature of the edge portions of the gate electrode 11 and further thicken the gate oxide film 10 under the lower edge portions of the gate electrode 11.

Thus, as explained as above, in the second embodiment, after the poly-Si layer is patterned to form the gate electrode 11, the gate oxide film 10 is etched until it is over-etched under the side edge portions of the gate electrode 11. Accordingly, the subsequently performed thermal oxidation can increase the radius of curvature of the edge portions of the gate electrode 11 and thicken the thickness of the gate oxide film 10 under the edge portions. Further, because the ion-implantation for forming the source regions 9 and the ion-implantation for forming the gate electrode 11 can be performed at a single step (simultaneously), the manufacturing process is simplified. The thermal oxidation that is performed after the ion-implantation can further increase the radius of curvature of the edge portions of the gate electrode 11 and thicken the gate oxide film 10 under the edge portions thereof.

In general, in the MOSFET shown in FIG. 1, the withstand voltage between the gate electrode and the source region is determined by the insulating withstand voltage at the edge portion of the gate electrode 11. This is because electrical field concentrates on the edge portion of the gate electrode 11 more easily than the middle portion (flat portion) of the gate electrode 11.

To the contrary, in the MOSFET of the present embodiment, because the radius of curvature of the edge portion of the gate electrode 11 is increased and the gate oxide film 10 is thicken under the edge portion of the gate electrode 11, the insulating withstand voltage and the lifetime of the gate oxide film 10 can be improved.

Also in the diode formation area, the peripheral edge corner portions of the poly-Si layer 16 are rounded. Therefore, even when high-voltage surge is applied to the n⁻ type epi-layer (drain side), electric field concentration can be restricted to prevent leakages, dielectric breakdown, and the like.

Figure 6:
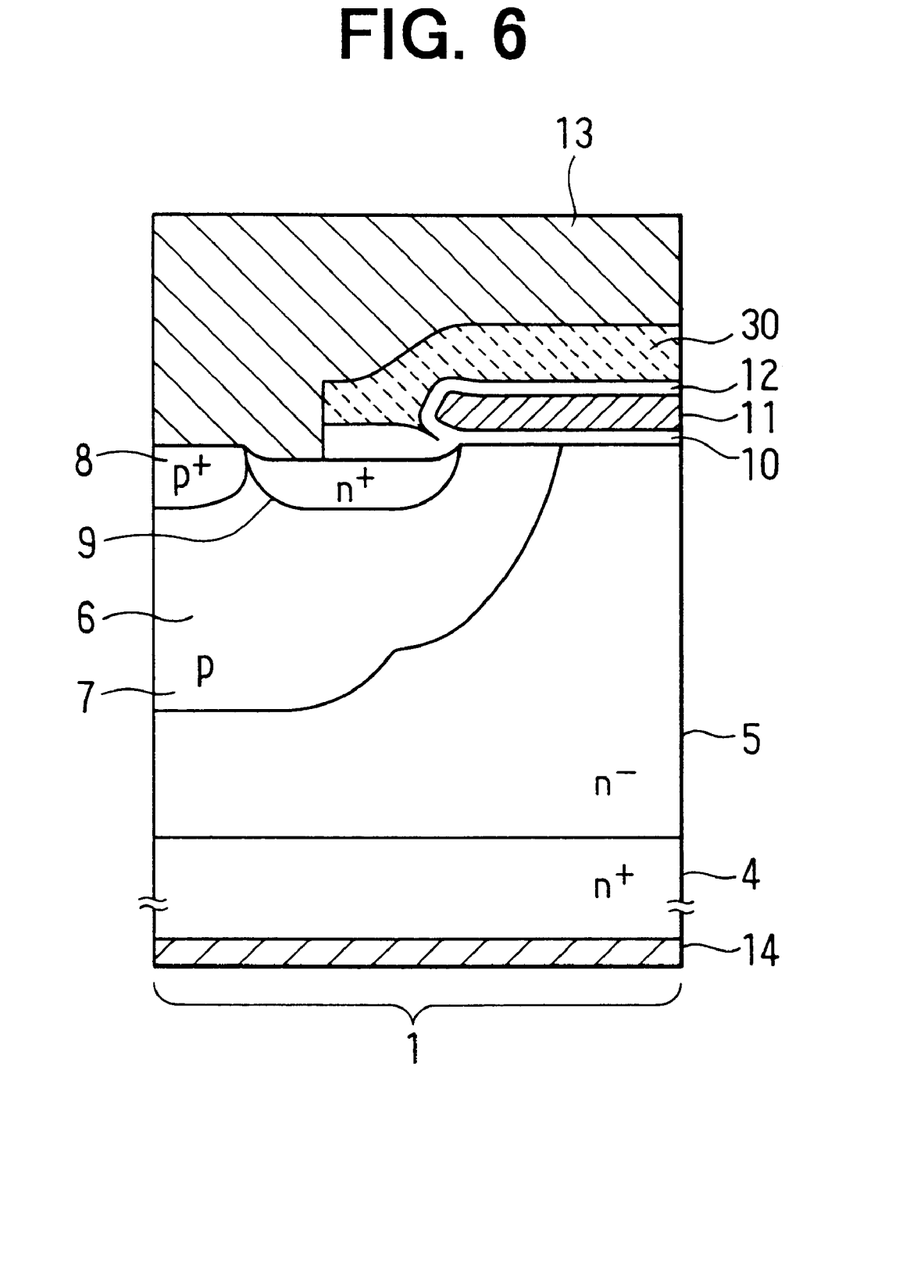
FIG. 6 is a cross-sectional view showing a modified structure of the semiconductor device in the second embodiment.

Although the gate electrode 11 is covered with the oxide film 12 in the second embodiment, an insulation film 30 made of BPSG or the like having suitable flowability may be deposited as shown in FIG. 6 which shows only the MOSFET formation area. This is because it is revealed that the oxide film 12 may have a slit portion in the vicinity of the gate electrode 11 as shown in FIG. 6. The insulation film 30 having flowability can fill the slit portion. Accordingly, the reliability of the element can be further improved.

In the embodiments described above, although the vertical power MOSFET is exemplified as a power semiconductor element, other elements such as an IGBT can be formed together with the Zener diode in one semiconductor device. Also in this case, the present invention is applicable as well. The diode structures are not limited to those illustrated in the first and second embodiments, but may have several annular equipotential plates that are made of poly-Si, as proposed in U.S. Pat. No. 5,475,258. Although the vertical power MOSFET adopted in the embodiment described above is an n-channel type, it may be a p-channel type.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method for manufacturing a semiconductor device having a power semiconductor element and a diode, comprising:

preparing a semiconductor substrate having a semiconductor layer of a first conductivity type;

forming an insulation film on the semiconductor layer;

disposing first and second electrode materials on the insulation film, the first electrode material being disposed in a first area for forming the power semiconductor element, the second electrode material being disposed in a second area for forming the diode;

forming a channel-well region of a second conductivity type in a surface portion of the semiconductor layer in the first area;

ion-implanting a first conductivity type impurity into a surface portion of the channel-well region to form a source region of the first conductivity type, into the first electrode material to form a gate electrode in the first area, and into a part of the second electrode material to form a first conductivity type region in the second area;

performing a heat treatment to form an oxide film by surface oxidation on the first area having the gate electrode and the source region, and on the second electrode material including the first conductivity type region; and ion-implanting a second conductivity type impurity into the channel-well region to form a contact region in the first area, and into the second electrode material to form a second conductivity type region in the second area, through the oxide film serving as a mask.

2. The method according to claim 1, wherein the first and second electrode materials are disposed on the first and second areas by forming an electrode material layer on the first and second areas and by patterning the electrode material layer.

3. The method according to claim 1, wherein:

in the heat treatment for forming the oxide film, accelerated oxidation occurs on a surface of the gate electrode, a surface of the source region, and a surface of the first conductivity type region; and the second conductivity type impurity is ion-implanted into the channel-well region and the second electrode material through the oxide film on a surface portion excluding the surface of the gate electrode, the surface of the source region, and the surface of the first conductivity type region.

4. The method according to claim 1, wherein the heat treatment for forming the oxide film is performed at 875° C. in wet atmosphere.

5. The method according to claim 4, wherein the second conductivity type impurity is ion-implanted at ion-implantation energy of 60 keV.

6. The method according to claim 1, wherein:

the first conductivity type is an n type; and;

the second conductivity type is a p type.

7. The method according to claim 1, further comprising removing the insulation film under a side edge portion of the first electrode material to expose a lower side corner portion of the first electrode material, after the first and second electrode materials are disposed, and before the heat treatment is performed.

8. The method according to claim 7, wherein a lower side corner portion of the second electrode material is exposed simultaneously with the lower side corner portion of the first electrode material, by removing the insulation film.

9. The method according to claim 8, wherein the insulation film is removed by wet etching using HF.

10. The method according to claim 8, wherein the lower side corner portions of the first electrode material and the second electrode material are rounded by oxidation before the channel-well region is formed.

11. The method according to claim 10, wherein the lower side corner portions of the first electrode material and the second electrode material are rounded by wet-oxidation.

12. A method for manufacturing a semiconductor device, comprising:

forming a gate insulation film on a semiconductor substrate;

forming a poly-Si layer on the gate insulation film;

patterning the poly-Si layer;

etching a first part of the gate insulation film exposed from the poly-Si layer and etching a second part of the gate insulation film existing under an edge portion of the poly-Si layer;

forming an oxide film that covers the poly-Si layer and a surface of the semiconductor substrate; and ion-implanting impurities into the poly-Si layer and a surface portion of the semiconductor substrate to reduce a resistance of the poly-Si layer and form an impurity region at the surface portion of the semiconductor substrate.

13. The method according to claim 12, further comprising performing a thermal oxidation after ion-implanting the impurities.

14. The method according to claim 12, further comprising forming an insulation film, having flowability, on the oxide film, after ion-implanting the impurities.

15. The method according to claim 12, wherein the gate insulation film is etched by using HF.

16. A method of claim 12, wherein the forming of a poly-Si layer on the gate insulation film comprises forming a poly-Si layer with cornered edges adjacent to the substrate; and further comprising increasing the radius of curvature of the cornered edges of the poly-Si layer by oxidation after the etching of a first part of the gate insulation film exposed from the poly-Si layer and the etching of a second part of the gate insulation film existing under an edge portion of the poly-Si layer.

17. A method of claim 12, wherein the forming of a poly-Si layer on the gate insulation film comprises forming a poly-Si layer with cornered edges adjacent to the substrate; and further comprising increasing the radius of curvature of the cornered edges of the poly-Si layer by the thermal oxidation.

* * * * *

UNITED STATES PATENT AND TRADEMARK OFFICE
CERTIFICATE OF CORRECTION

PATENT NO.     : 6,451,645 B1
DATED          : September 17, 2002
INVENTOR(S)    : Yoshihiko Ozeki, Yoshifumi Okabe and Yutaka Tomatsu It is certified that error appears in the above-identified patent and that said Letters Patent is hereby corrected as shown below:

<u>Title page,</u>
Item [73], Assignee, Denso Corporation, Kariya (JP)

Signed and Sealed this

Twentieth Day of July, 2004

JON W. DUDAS
*Acting Director of the United States Patent and Trademark Office*